United States Patent
Mantese et al.

(10) Patent No.: US 10,337,121 B2
(45) Date of Patent: Jul. 2, 2019

(54) SEPARATE VESSEL METAL SHIELDING METHOD FOR MAGNETIC FLUX IN DIRECTIONAL SOLIDIFICATION FURNACE

(71) Applicant: United Technologies Corporation, Farmington, CT (US)

(72) Inventors: Joseph V. Mantese, Ellington, CT (US); Ryan C. Breneman, West Hartford, CT (US); Thomas Anthony Rebbecchi, Hartford, CT (US); Andrew Boyne, West Hartford, CT (US); John Joseph Marcin, Marlborough, CT (US); Dustin W. Davis, Marlborough, CT (US); David Ulrich Furrer, Marlborough, CT (US); James Tilsley Auxier, Bloomfield, CT (US)

(73) Assignee: United Technologies Corporation, Farmington, CT (US)

( * ) Notice: Subject to any disclaimer, the term of this patent is extended or adjusted under 35 U.S.C. 154(b) by 0 days.

(21) Appl. No.: 15/797,855

(22) Filed: Oct. 30, 2017

(65) Prior Publication Data

US 2019/0127882 A1    May 2, 2019

(51) Int. Cl.
| | |
|---|---|
| C30B 11/08 | (2006.01) |
| C30B 30/04 | (2006.01) |
| C30B 21/02 | (2006.01) |
| H05B 6/06 | (2006.01) |
| H05B 6/10 | (2006.01) |
| F27D 11/06 | (2006.01) |
| F27D 99/00 | (2010.01) |

(52) U.S. Cl.
CPC .............. *C30B 30/04* (2013.01); *C30B 21/02* (2013.01); *F27D 11/06* (2013.01); *H05B 6/067* (2013.01); *H05B 6/105* (2013.01); *F27D 2099/0015* (2013.01)

(58) Field of Classification Search
CPC .............................. C30B 11/002; C30B 11/08
See application file for complete search history.

(56) References Cited

U.S. PATENT DOCUMENTS

| | | | |
|---|---|---|---|
| 5,848,635 A | 12/1998 | Aoi et al. | |
| 5,901,170 A | 5/1999 | Peysakhovich et al. | |
| 6,059,015 A * | 5/2000 | Bewlay | F27B 14/063 |
| | | | 164/122.1 |
| 8,242,420 B2 * | 8/2012 | Fishman | C30B 11/003 |
| | | | 117/223 |
| 9,476,645 B2 * | 10/2016 | Keough | F27B 14/061 |
| 2010/0238967 A1 | 9/2010 | Bullied et al. | |
| 2012/0297580 A1 * | 11/2012 | Dughiero | B22D 27/045 |
| | | | 23/295 R |
| 2013/0276939 A1 | 10/2013 | Ebisu | |

* cited by examiner

*Primary Examiner* — Robert M Kunemund
(74) *Attorney, Agent, or Firm* — Bachman & LaPointe, P.C.

(57) ABSTRACT

An induction furnace assembly comprising a chamber having a mold; a primary inductive coil coupled to the chamber; a susceptor surrounding the chamber between the primary inductive coil and the mold; and a shield material contained in a reservoir coupled to or proximate the mold between the susceptor and the mold; the shield material configured to attenuate a portion of an electromagnetic flux generated by the primary induction coil that is not attenuated by the susceptor.

14 Claims, 2 Drawing Sheets

SEPARATE VESSEL METAL SHIELDING METHOD FOR MAGNETIC FLUX IN DIRECTIONAL SOLIDIFICATION FURNACE

BACKGROUND

The present disclosure is directed to a device for directional solidification of a cast part. More particularly, this disclosure relates to a directional solidification casting device that controls an electromagnetic field to provide a desired microstructure.

A directional solidification (DS) casting process is utilized to orient crystal structure within a cast part. The desired orientation is provided by moving a mold from a hot zone within a furnace into a cooler zone at a desired rate. As the mold moves into the cooler zone, the molten material solidifies along a solidification front travelling in one direction.

Mixing of the molten material at the solidification front within the cast component is known to be deleterious to the quality of single crystal castings. Such mixing can be induced in the molten metal material by a electromagnetic field generated from an energized coil encircling the furnace cavity. Typically, an induction withdrawal furnace utilizes such an electric coil that produces energy required for maintaining the metal in a molten state. A susceptor is utilized to transduce an electromagnetic field produced by the electric coil into radiant heat transferred to the casting mold.

The susceptor is usually a graphite cylinder located internal to the induction coil and external to the mold. The susceptor is heated by induction coils and radiates heat toward the mold to maintain metal in a molten state, and is intended to isolate the electromagnetic field from the hot zone of the furnace.

Casting single crystal gas turbine parts can experience less than 100% yields. Some defects that occur during the casting process are separately nucleated grains, freckels, porosity, mis-oriented boundaries, and others. The causes of these defects are not always known, but have been empirically determined to be influenced by the geometry of the part and the relative orientation of the part and the mold in the furnace. It is hypothesized that remnant magnetic field in the interior of the susceptor may be detrimental to the production of the desired microstructure in a cast part. Calculations have been made estimating the significance for a given production furnace design.

It has been recognized that the leakage of the electromagnetic field into the furnace hot zone could directly influence the solidification process during casting.

SUMMARY

In accordance with the present disclosure, there is provided a process for directional solidification of a cast part comprising energizing a primary induction coil coupled to a chamber having a mold containing a material; energizing the primary induction coil within the chamber to heat the mold, wherein the resultant electromagnetic field partially leaks through a susceptor coupled to the chamber between the primary induction coil and the mold; controlling a component of the leaked magnetic flux with a shield material coupled to the mold; and casting the material within the mold.

In another and alternative embodiment, the component of the magnetic flux comprises a portion of the total electromagnetic field passing through the mold that is not attenuated by the susceptor.

In another and alternative embodiment, the susceptor comprises a constant thickness.

In another and alternative embodiment, the shield material attenuates a portion of the electromagnetic flux generated by the primary induction coil that is not attenuated by the susceptor.

In another and alternative embodiment, the process further comprises a reservoir coupled to the mold, the reservoir is configured to contain the shield material.

In another and alternative embodiment, the reservoir is proximate the mold.

In another and alternative embodiment, the reservoir is integral with the mold.

In accordance with the present disclosure, there is provided an induction furnace assembly comprising a chamber having a mold; a primary induction coil is coupled to the chamber; a susceptor surrounds the chamber between the primary induction coil and the mold; and a shield material is contained in a reservoir coupled to the mold between the susceptor and the mold; the shield material is configured to attenuate a portion of an electromagnetic field generated by the primary induction coil that is not attenuated by the susceptor.

In another and alternative embodiment, the reservoir is integral with the mold.

In another and alternative embodiment, the reservoir is adjacent to the mold.

In another and alternative embodiment, the reservoir is proximate and unattached from the mold.

In another and alternative embodiment, the shield material comprises an attenuator configured to attenuate a total electromagnetic field generated by said primary induction coil.

In another and alternative embodiment, the shield material comprises material properties configured to attenuate the electromagnetic field at casting temperatures.

In another and alternative embodiment, the shield material is identical to a casting material in the mold.

Other details of the device for directional solidification of a cast part are set forth in the following detailed description and the accompanying drawings wherein like reference numerals depict like elements.

DETAILED DESCRIPTION

Figure 1:
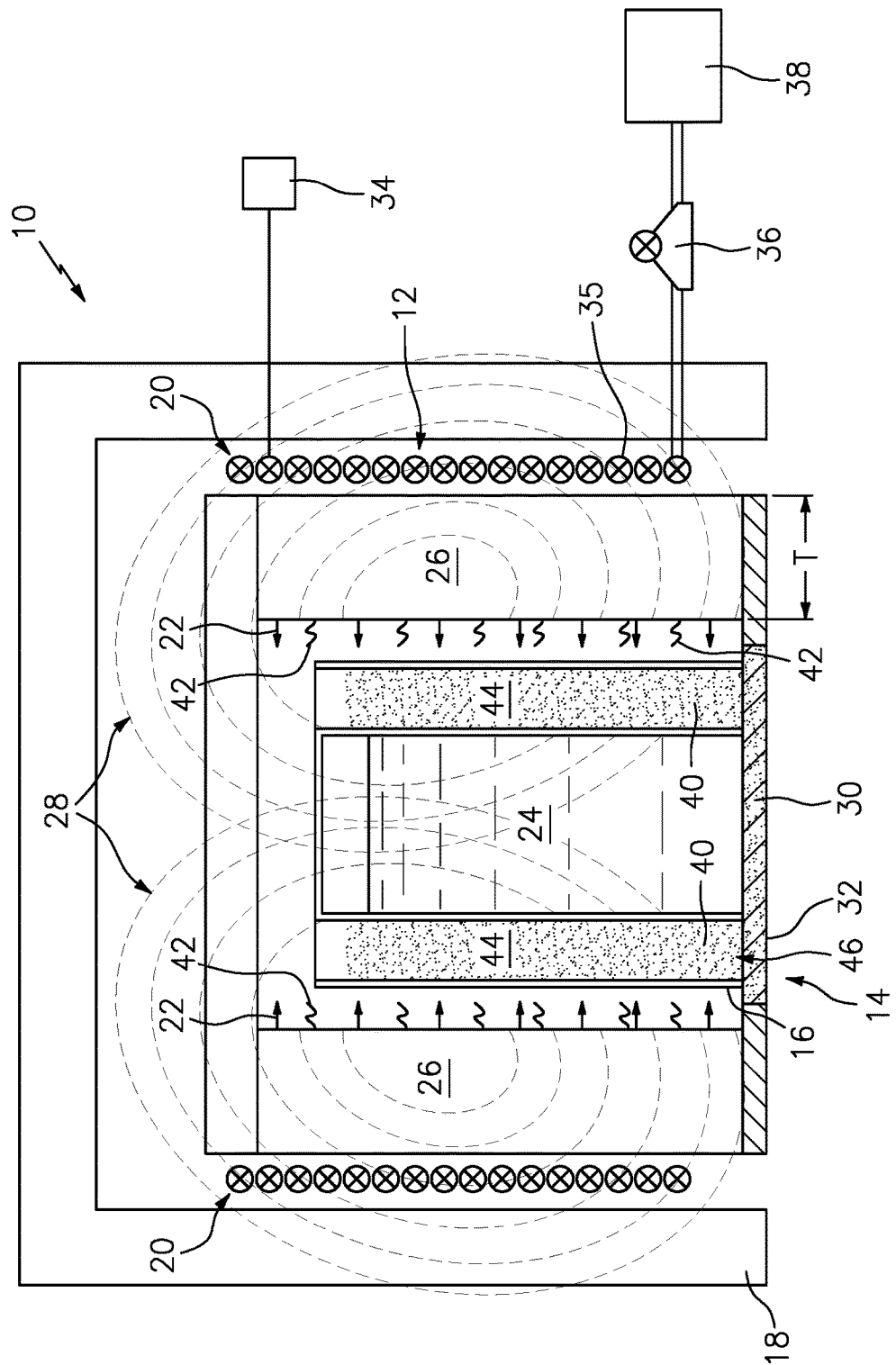
FIG. 1 is a schematic illustration of an exemplary induction furnace with a mold disposed within the furnace and an attenuator.

Referring to FIG. 1, an exemplary induction furnace assembly 10 includes a chamber 12 that includes an opening 14 through which a mold 16 is received and withdrawn. The chamber 12 is isolated from the external environment by insulated walls 18. A primary inductive coil 20 generates an electromagnetic field which is converted into heat by the susceptor. Heat, indicated by arrows 22, serves to heat a material 24 within the mold 16 to a desired temperature.

The exemplary furnace assembly 10 includes a susceptor 26 that partially absorbs the electromagnetic field (schematically shown at 28) that is generated by the primary induction coil 20. The susceptor 26 is a wall that surrounds the chamber 12. The susceptor 26 is fabricated from material such as graphite that absorbs the electromagnetic field 28 produced by the primary induction coil 20. The susceptor 26 can also provide for the translation of energy from the electromagnetic field into heat energy, as indicated at arrows 22 to further maintain a temperature within the mold 16. In the disclosed example, molten metal material 24 is disposed in the mold 16 which in turn is supported on a support 30. The support 30 includes a chill plate 32 that both supports the mold 16 and includes cooling features to aid in cooling and directional solidification of the molten material 24.

The primary induction coil 20 receives electrical energy from an electric power source schematically indicated at 34. This electrical energy is provided at a desired current level determined to provide sufficient power and energy to create the desired temperature within the chamber 12 that maintains the metal 24 in a molten state.

The primary induction coil 20 comprises a plurality of electrically conductive hollow tubes 35. The plurality of tubes 35 also provide for the circulation of a fluid that is generated by a pump 36 that supplies fluid from a fluid source 38 to flow through the tubes 35.

In operation, the furnace 10 is brought up to a desired temperature by providing a sufficient current from the electric power source 34 to the primary induction coil 20. Water supplied from the pump 36 and fluid source 38 is pumped through the plurality of tubes 35 that make up the induction coil 20. The heat 22 created by the partial conversion of the electromagnetic field by the susceptor 26 heats the core furnace zone in the chamber 12 to a desired temperature. Once a desired temperature is reached, molten material, metal 24 is poured into the mold 16. The mold 16 defines the external shape and features of the completed cast article.

In the exemplary directional solidification casting process utilized, after the molten material 24 is poured into the mold 16 within the chamber 12 the material 24 is maintained at a desired temperature in a molten state. The support 30 and chill plate 32 are then lowered from the opening 14 out of the hot chamber 12 through a baffle. The mold 16 is lowered from the chamber 12 at a desired rate to cool the molten material 24 in a controlled manner to produce desired columnar structure or single crystal. The controlled cooling produces a solidification front within the molten material 24.

In many applications, the completed cast part is desired to include a specific grain structure. The size, orientation, and structure of grains within the completed cast part provide desired material characteristics and performance, such as for example material fatigue performance. The exemplary furnace assembly 10 includes the susceptor 26 with a constant thickness. The portion of electromagnetic field 28 that passes the susceptor 26, that is, magnetic flux leakage 42, has potential to generate a certain amount of magnetic stirring within the molten metal material 24.

The generated electromagnetic field 28 not absorbed by the susceptor has a potential to produce currents within the molten metal material 24 that interact with the molten metal material 24 to provide stirring which may in turn, negatively impact the formation of the desired microstructure, such as inhibit defect-free single crystal growth. In a standard induction furnace, the susceptor 26 is sized to include a thickness that is thick enough to shield the electromagnetic field within the hot zone of the chamber 12. However, it has been discovered that a certain amount of electromagnetic field 28 may leak past the susceptor 26. This leakage of electromagnetic field, that is, leaked magnetic flux 42 may be unwanted and detrimental to proper grain structure formation.

Figure 2:
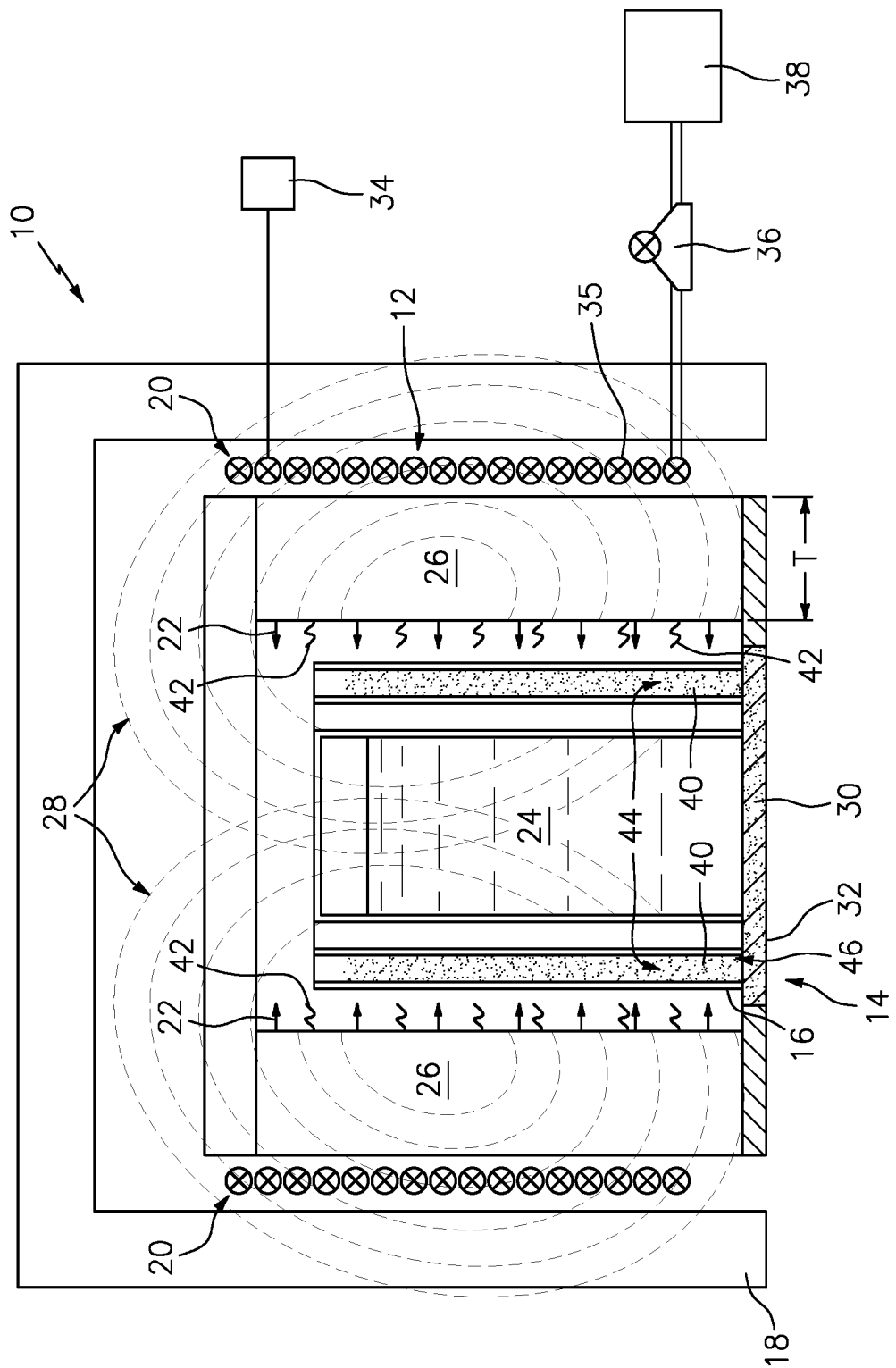
FIG. 2 is a schematic illustration of an exemplary induction furnace with a mold disposed within the furnace and an attenuator.

The exemplary mold 16 includes a reservoir 40 coupled to the mold 16. The reservoir 40 can be integral with the mold 16. As shown in FIG. 2, in an alternative embodiment, the reservoir 40 can be adjacent to the mold 16. In an alternative embodiment, the reservoir 40 can be proximate but not attached to the mold 16. The reservoir 40 is configured to attenuate, block and/or reflect the electromagnetic field 28 that leaks past the susceptor 26, namely, magnetic flux leakage 42, or simply magnetic flux 42. The reservoir 40 can contain a shield material 44 that further blocks or attenuates the magnetic flux leakage 42 generated from the electromagnetic field 28. The shield material 44 in the reservoir 40 can be selected depending on the magnetic flux leakage 42 at predetermined locations, such as proximate the mold 16, within the chamber 12, within the mold 16, and the like. The magnetic flux leakage 42 can include the portions of the electromagnetic field 28 passing into the mold 16 that are not absorbed by the susceptor 26.

The reservoir 40 can contain the shield material 44 between the casting material 24 in the mold 16 and the susceptor 26. The shield material 44 can be reusable. The shield material 44 can attenuate the magnetic flux leakage 42 and act as an attenuator 46. The shield material 44 can be selected for its capacity as an electromagnetic shield/attenuator 46 for the induced stirring caused by the leaked magnetic flux 42. The shield material 44 can include properties to shield the leaked magnetic flux 42 at the casting temperatures. In an exemplary embodiment, the shield material 44 can be identical to the casting material 24. Different shield materials 44 can be selected for casting different material 24 alloys in predetermined temperature ranges. The shield material 44 can be selected for the magnetic permeability and high magnetic Curie point, for example cobalt. In an exemplary embodiment, the shield material can be compositionally equivalent to the material being cast 24. In another exemplary embodiment, the shield material 44 can comprise at least one of a castable Nickel-based or Co-based superalloy, castable ferrous alloys and the like. In another exemplary embodiment, the shield material 44 can comprise cobalt, iron, mu metals, titanium, and the metal oxide ferrites. The shield material 44 can have properties that attenuate the magnetic flux 42 that reaches the mold 16.

The utilization of the shield material 44 as disclosed can reduce grain defects in single crystal castings via reduction or mitigation of inductive stirring.

It is desirable to control the magnetic stirring within the molten material 24 as the mold 16 leaves the hot chamber 12 along the withdrawal path to produce the desired grain structure within the completed cast part.

Accordingly, the disclosed exemplary induction furnace assembly provides for the control of electromagnetic flux and resultant stirring based on a reservoir with shield material proximate the mold that in turn reduces grain defects and produces the desired grain structures with the cast part.

There has been provided a device for directional solidification of a cast part. While the device for directional solidification of a cast part has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:

1. A process for directional solidification of a cast part comprising:
   energizing a primary induction coil within a chamber having a mold containing a material;
   generating an electromagnetic field with the primary induction coil within the chamber, wherein said electromagnetic field partially leaks through a susceptor coupled to said chamber between said primary induction coil and said mold;
   controlling a component of a magnetic flux leakage with a shield material coupled to the mold; and
   casting the material within the mold.

2. The process according to claim 1, wherein said component of said magnetic flux leakage comprises a portion of a total electromagnetic field passing through said mold that is not attenuated by the susceptor.

3. The process according to claim 2, wherein said susceptor comprises a constant thickness.

4. The process according to claim 2, wherein the shield material attenuates a portion of the magnetic flux leakage generated by the primary induction coil that is not attenuated by the susceptor.

5. The process according to claim 1, further comprising:
   a reservoir coupled to said mold, said reservoir configured to contain said shield material.

6. The process according to claim 5, wherein said reservoir is proximate said mold.

7. The process according to claim 1, wherein said reservoir is integral with said mold.

8. An induction furnace assembly comprising:
   a chamber having a mold;
   a primary induction coil coupled to said chamber;
   a susceptor surrounding said chamber between said primary induction coil and said mold; and
   a shield material contained in a reservoir coupled to said mold between said susceptor and said mold; said shield material configured to attenuate a portion of an electromagnetic field generated by the primary induction coil that is not attenuated by said susceptor.

9. The induction furnace assembly according to claim 8; wherein the reservoir is integral with the mold.

10. The induction furnace assembly according to claim 8, wherein the reservoir is adjacent to the mold.

11. The induction furnace assembly according to claim 8, wherein the reservoir is proximate and unattached from the mold.

12. The induction furnace assembly according to claim 8, wherein the shield material comprises an attenuator configured to attenuate a total electromagnetic field generated by said primary induction coil.

13. The induction furnace assembly according to claim 8, wherein the shield material comprises material properties configured to attenuate the electromagnetic field at casting temperatures.

14. The induction furnace assembly according to claim 8, wherein the shield material is identical to a casting material in said mold.

* * * * *